United States Patent
Zhang et al.

(10) Patent No.: US 11,469,211 B2
(45) Date of Patent: Oct. 11, 2022

(54) CHIP-ON-FILM STRUCTURE, DISPLAYING BASE PLATE AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Shuang Zhang, Beijing (CN); Weihong Wu, Beijing (CN); Feifan Li, Beijing (CN); Ajuan Du, Beijing (CN); Xiaoxia Huang, Beijing (CN); Liang Gao, Beijing (CN); Hufei Yang, Beijing (CN); Enjian Yang, Beijing (CN); Hao Sun, Beijing (CN); Bin Wang, Beijing (CN); Dong Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 2 days.

(21) Appl. No.: 17/223,165

(22) Filed: Apr. 6, 2021

(65) Prior Publication Data

US 2022/0093563 A1 Mar. 24, 2022

(30) Foreign Application Priority Data

Sep. 23, 2020 (CN) .......................... 202011011674.3

(51) Int. Cl.
*H01L 23/498* (2006.01)
*H01L 25/065* (2006.01)

(52) U.S. Cl.
CPC .... *H01L 25/0655* (2013.01); *H01L 23/49838* (2013.01)

(58) Field of Classification Search
CPC ................. H01L 25/0655; H01L 23/49838
See application file for complete search history.

(56) References Cited

U.S. PATENT DOCUMENTS

| | | | | |
|---|---|---|---|---|
| 6,050,830 A * | 4/2000 | Tanaka | .................. | H05K 3/361 439/67 |
| 2009/0027366 A1* | 1/2009 | Kim | .................. | G09G 3/3685 327/108 |
| 2013/0063912 A1* | 3/2013 | Liao | .................. | H05K 13/0084 29/592.1 |
| 2019/0348358 A1* | 11/2019 | Chen | .................. | H01L 23/5387 |

* cited by examiner

Primary Examiner — Sherman Ng
(74) Attorney, Agent, or Firm — WHDA, LLP

(57) ABSTRACT

A Chip-On-Film structure, a displaying base plate and a displaying device, wherein the Chip-On-Film structure includes a first substrate; a plurality of driving chips provided on one side of the first substrate, and a plurality of first leads that are connected to the plurality of driving chips; and the plurality of first leads are for binding a displaying base plate, and a quantity of the first leads is greater than or equal to a sum of quantities of channels of the plurality of driving chips.

16 Claims, 4 Drawing Sheets

CHIP-ON-FILM STRUCTURE, DISPLAYING BASE PLATE AND DISPLAYING DEVICE

CROSS REFERENCE TO RELEVANT APPLICATIONS

The present disclosure claims the priority of the Chinese patent application filed on Sep. 23, 2020 before the Chinese Patent Office with the application number of 202011011674.3 and the title of "CHIP-ON-FILM STRUCTURE, DISPLAYING BASE PLATE AND DISPLAYING DEVICE", which is incorporated herein in its entirety by reference.

TECHNICAL FIELD

The present disclosure relates to the technical field of displaying, and particularly relates to a Chip-On-Film structure, a displaying base plate and a displaying device.

BACKGROUND

Currently, medium- and large-size display products (for example, Pad and NB) are usually required to bind a plurality of driving chips, and the driving chips may be bound to the displaying base plate by using a Chip-On-Film (COF) structure. As the resolution of display products are becoming increasingly higher, it emerges that display products of different sizes (for example, 14.0", 13.3" and 13.4") have the same resolution. Displaying base plates of the same resolution are required to bind the same quantity of driving chips to drive the displaying base plates to display. For example, a displaying base plate of the resolution of 3840*2160 UHD requires 6 driving chips with 1920 channels.

SUMMARY

The present disclosure provides a Chip-On-Film structure, a displaying base plate and a displaying device.

The present disclosure discloses a Chip-On-Film structure, wherein the Chip-On-Film structure comprises:

a first substrate;

a plurality of driving chips provided on one side of the first substrate, and a plurality of first leads that are connected to the plurality of driving chips; and the plurality of first leads are for binding a displaying base plate, and a quantity of the first leads is greater than or equal to a sum of quantities of channels of the plurality of driving chips.

In an alternative embodiment, the Chip-On-Film structure comprises two or three instances of the driving chips.

In an alternative embodiment, the plurality of first leads are arranged in a first direction, the plurality of first leads are arranged into a predetermined quantity of rows, and the predetermined quantity is greater than or equal to 2.

In an alternative embodiment, the predetermined quantity is 3.

In an alternative embodiment, a spacing between any two of the driving chips in the first direction is greater than or equal to 4 mm and less than or equal to 8 mm.

In an alternative embodiment, when the Chip-On-Film structure comprises three instances of the driving chips, a spacing between any two neighboring instances of the driving chips in a direction perpendicular to the first direction is greater than or equal to 4 mm.

In an alternative embodiment, a spacing between each of the driving chips and a first boundary of the first substrate is greater than or equal to 2 mm, wherein the first boundary is a boundary of the first substrate that is perpendicular to the first direction.

The present disclosure further discloses a displaying base plate, wherein the displaying base plate is applied to the Chip-On-Film structure according to any one of the above embodiments, the displaying base plate comprises a binding region, and the binding region of the displaying base plate comprises:

a second substrate; and one or more bonding pads provided on one side of the second substrate, wherein each of the bonding pads comprises a plurality of second leads, and the second leads are for binding different instances of the first leads.

In an alternative embodiment, the displaying base plate comprises a plurality of the bonding pads, and a spacing between two neighboring instances of the bonding pads is greater than or equal to 4 mm.

In an alternative embodiment, when the first leads are arranged into a predetermined quantity of rows, the second leads are arranged in the first direction into the predetermined quantity of rows.

The present disclosure further discloses a displaying device, wherein the displaying device comprises a displaying base plate and the Chip-On-Film structure according to any one of the above embodiments, the displaying base plate comprises a binding region, and the Chip-On-Film structure is located at the binding region.

In an alternative embodiment, the binding region of the displaying base plate comprises:

a second substrate; and one or more bonding pads provided on one side of the second substrate, wherein each of the bonding pads comprises a plurality of second leads, and the second leads are for binding different instances of the first leads.

In an alternative embodiment, the displaying base plate comprises a plurality of the bonding pads, and a spacing between two neighboring instances of the bonding pads is greater than or equal to 4 mm.

In an alternative embodiment, when the first leads are arranged into a predetermined quantity of rows, the second leads are arranged in the first direction into the predetermined quantity of rows.

In an alternative embodiment, the displaying device comprises a plurality of instances of the Chip-On-Film structure, a quantity of the bonding pads in the displaying base plate is equal to a quantity of the Chip-On-Film structures, and the Chip-On-Film structures are located on different instances of the bonding pads.

In an alternative embodiment, a spacing between two neighboring instances of the Chip-On-Film structures is greater than or equal to 4 mm.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments.

Figure 1:
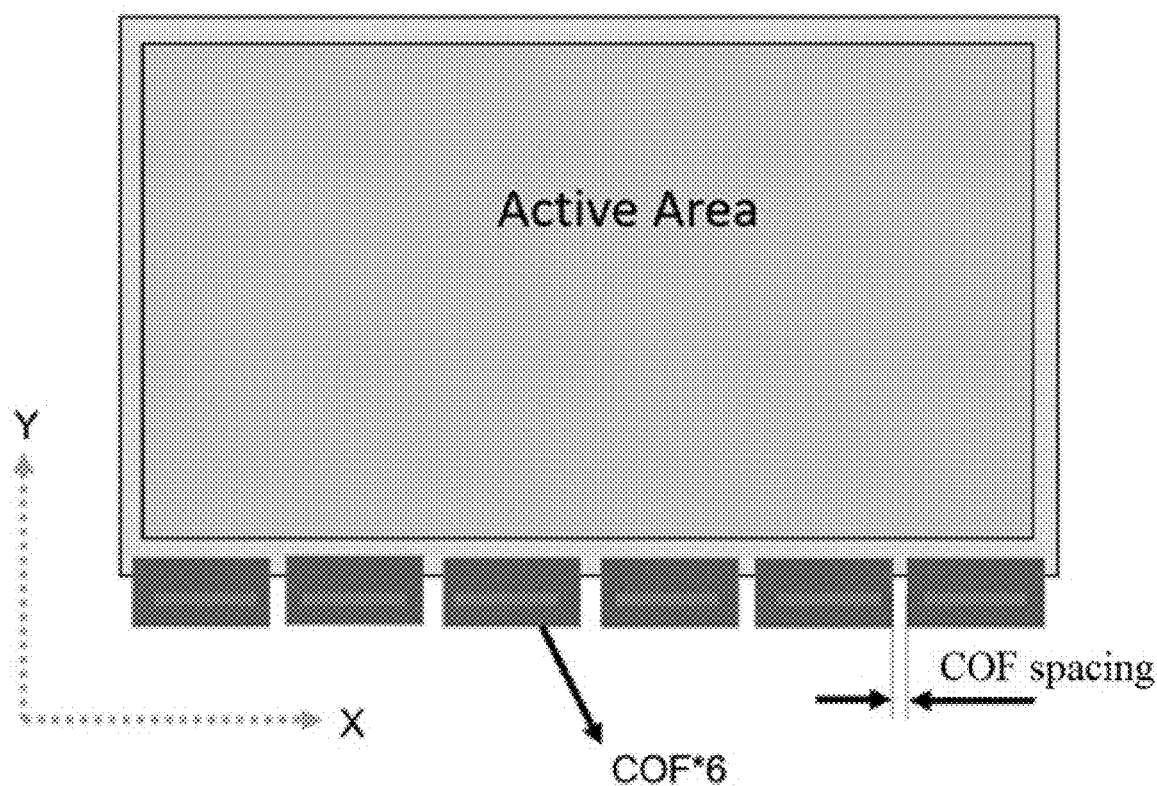
FIG. 1 shows a schematic structural diagram of a displaying device in the related art.
Figure 2:
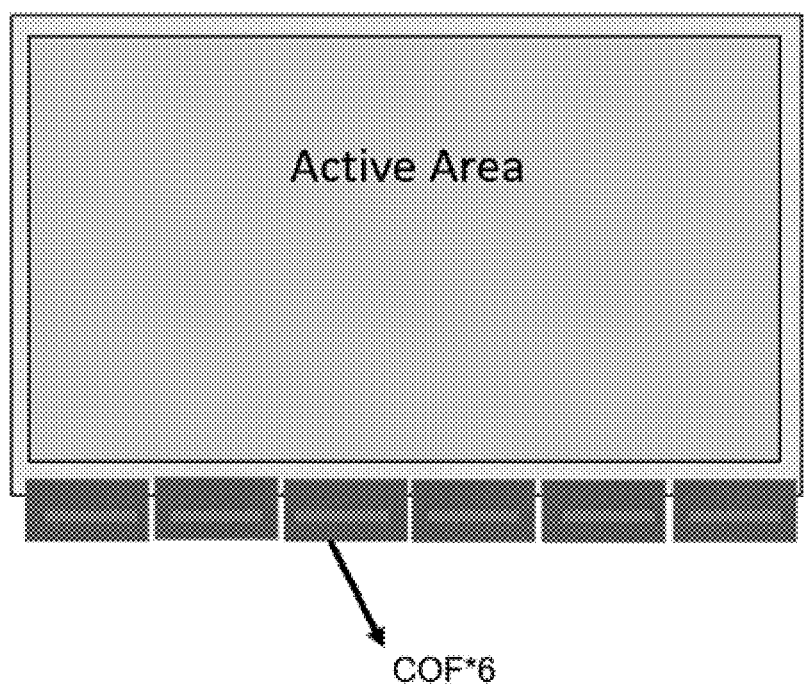
FIG. 2 shows a schematic structural diagram of another displaying device in the related art.

Referring to FIG. 1, FIG. 1 shows a schematic structural diagram of a 14.0" displaying device in the related art. Referring to FIG. 2, FIG. 2 shows a schematic structural diagram of a 13.4" displaying device in the related art. Both of the resolutions of the two displaying devices are 3840*2160, both of the two displaying devices are formed by binding 6 driving chips (1920 channels) to a displaying base plate by using 6 Chip-On-Film structures (COF), one driving chip is arranged on one Chip-On-Film structure, and the X-direction dimensions of the Chip-On-Film structures COF employed by the two modules are equal. Because the X-direction dimensions of the displaying base plates in the two displaying devices are different, the spacing between the Chip-On-Film structures COF on the smaller-size displaying base plate (for example, 13.4") is too low, as shown in FIG. 2, which cannot satisfy the requirement by the production process of COF spacing ≥4 mm.

Figure 3:
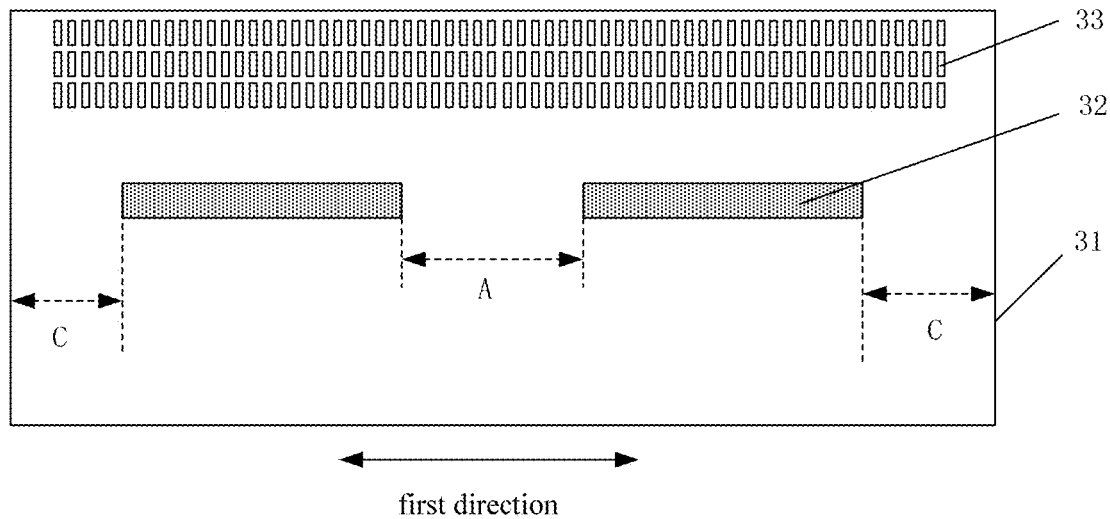
FIG. 3 shows a planar structural schematic diagram of the Chip-On-Film structure according to an embodiment of the present disclosure.
Figure 4:
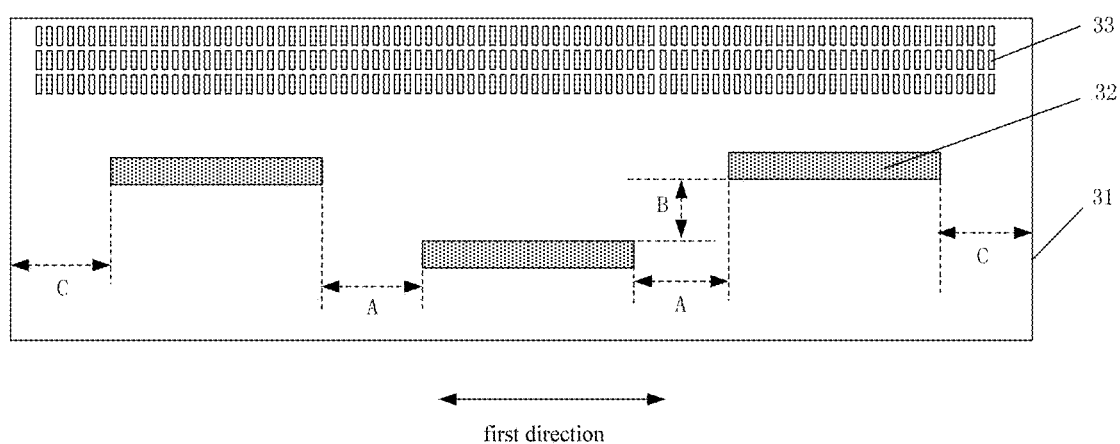
FIG. 4 shows a planar structural schematic diagram of another Chip-On-Film structure according to an embodiment of the present disclosure.

In order to increase the spacing between the Chip-On-Film structures, an embodiment of the present disclosure provides a Chip-On-Film structure. Referring to FIGS. 3 and 4, the Chip-On-Film structure comprises: a first substrate 31; a plurality of driving chips 32 provided on one side of the first substrate 31, and a plurality of first leads 33 that are connected to the plurality of driving chips 32; and the plurality of first leads 33 are for binding a displaying base plate, and the quantity of the first leads 33 is greater than or equal to the sum of the quantities of channels of the plurality of driving chips 32.

In a particular embodiment, two or more driving chips 32 may be provided on the first substrate 31, and the driving chips 32 are connected to the first leads 33 via the channels. The channels may particularly be the signal output channels of the driving chips 32.

The Chip-On-Film structure according to the present embodiment, by arranging a plurality of driving chips, can reduce the quantity of the Chip-On-Film structures in the displaying device, and increase the spacing between the Chip-On-Film structures, which, during the technical process of binding the Chip-On-Film structures, can prevent adverse effects by a high temperature on the Chip-On-Film structures that have been completely bound, thereby satisfying the requirements by the process and the production.

In an alternative embodiment, the Chip-On-Film structure according to the present embodiment may comprise two driving chips 32.

Figure 7:
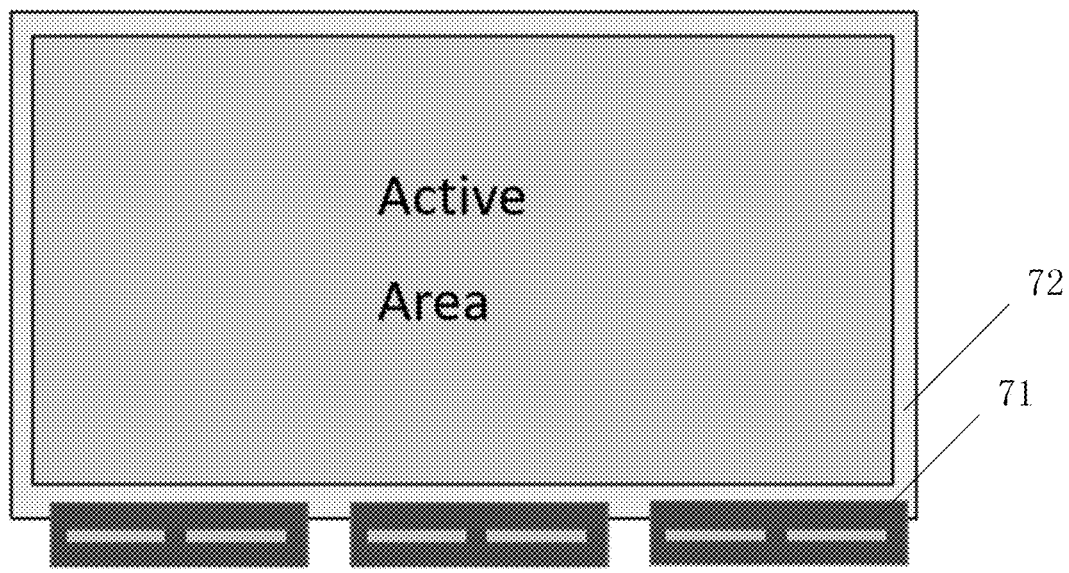
FIG. 7 shows a planar structural schematic diagram of the displaying device according to an embodiment of the present disclosure.

As shown in FIG. 3, two driving chips 32 are bound in parallel in a first direction on the first substrate 31. As compared with the technique in which each of the Chip-On-Film structures comprises merely one driving chip 32, that can reduce the dimension in the first direction that is occupied by two driving chips 32, and can reduce the quantity of the Chip-On-Film structures in the displaying device by 50%. For example, regarding the displaying devices shown in FIGS. 1 and 2, merely three Chip-On-Film structures are required to be bound (as shown in FIG. 7). Therefore, by using the Chip-On-Film structure comprising two driving chips, the embodiment of the present disclosure can reduce the quantity of the Chip-On-Film structures in the displaying device, and increase the spacing between the Chip-On-Film structures, thereby satisfying the requirements by the process and the production.

In an alternative embodiment, the Chip-On-Film structure according to the present embodiment may comprise three driving chips 32.

Figure 8:
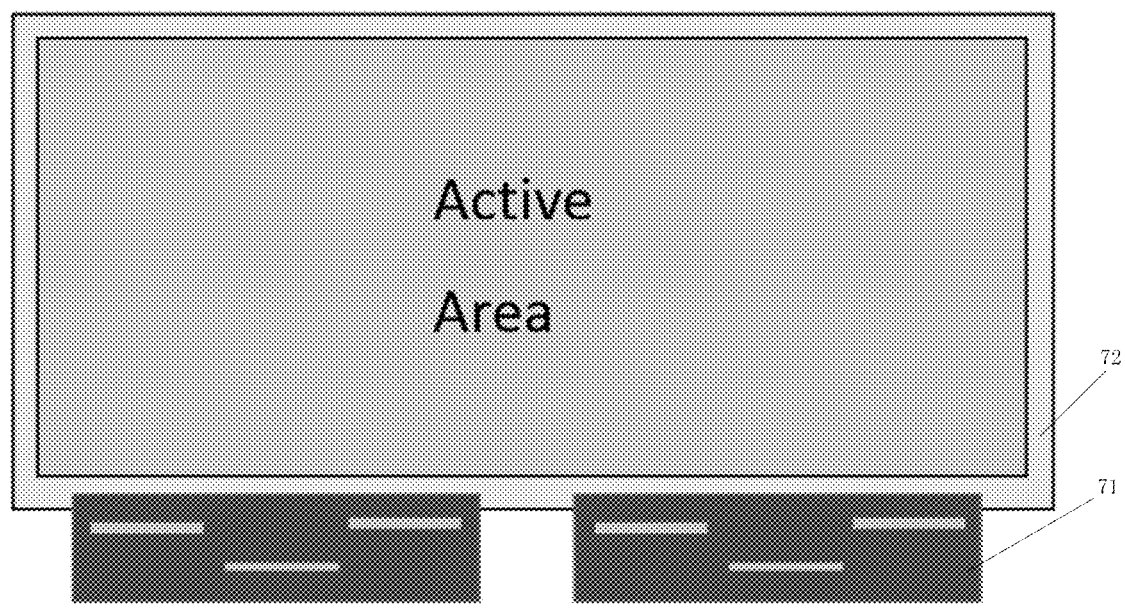
FIG. 8 shows a planar structural schematic diagram of another displaying device according to an embodiment of the present disclosure.

As shown in FIG. 4, three driving chips 32 are bound on the first substrate 31. As compared with the technique in which each of the Chip-On-Film structures comprises merely one driving chip 32, that can reduce the dimension in the first direction that is occupied by three driving chips 32, and can reduce the quantity of the Chip-On-Film structures in the displaying device by two thirds. For example, regarding the displaying devices shown in FIGS. 1 and 2, merely two Chip-On-Film structures are required to be bound (as shown in FIG. 8). Therefore, by using the Chip-On-Film structure comprising three driving chips, the embodiment of the present disclosure can reduce the quantity of the Chip-On-Film structures in the displaying device, and increase the spacing between the Chip-On-Film structures, thereby satisfying the requirements by the process and the production.

Referring to FIGS. 3 and 4, the plurality of first leads 33 are arranged in the first direction, and the plurality of first leads 33 may be arranged into a predetermined quantity of rows. Taking into consideration the limitation by the size of the Chip-On-Film structure in the first direction, the predetermined quantity may be greater than or equal to 2. For example, the predetermined quantity may be 3; in other words, the plurality of first leads 33 may be arranged into three rows.

Because the Chip-On-Film structure comprises the plurality of driving chips, and the plurality of driving chips have a large sum of the signal output channels, a large quantity of the first leads 33 are required. If the plurality of first leads 33 are arranged into one row, the spacing between the first leads 33 will be too small, which has a high requirement on the subsequent binding process. Therefore, in order not to increase the difficulty in the subsequent binding process, the plurality of first leads 33 may be arranged into two rows, three rows or more rows.

In an alternative embodiment, Referring to FIGS. 3 and 4, the spacings A between any two driving chips 32 on the first substrate 31 in the first direction may be greater than or equal to 4 mm and less than or equal to 8 mm. That cannot only prevent interference between the channels of the driving chips, but also can ensure that the size of the Chip-On-Film structure can satisfy the process requirements.

In an alternative embodiment, Referring to FIG. 4, when the Chip-On-Film structure comprises three driving chips, the spacings B between any two neighboring driving chips 32 in the direction perpendicular to the first direction may be greater than or equal to 4 mm.

In an alternative embodiment, Referring to FIGS. 3 and 4, the spacings C between the driving chips 32 and first boundaries of the first substrate 31 may be greater than or equal to 2 mm, wherein the first boundaries are the boundaries of the first substrate 31 that are perpendicular to the first direction, i.e., the left and right boundaries of the Chip-On-Film structure in FIGS. 3 and 4.

The Chip-On-Film structure according to the present embodiment, by arranging two or three driving chips at the same time on the first substrate, can reduce the quantity of the Chip-On-Film structures in the displaying device, and increase the spacing between the Chip-On-Film structures, thereby satisfying the requirements by the process and the production.

Figure 5:
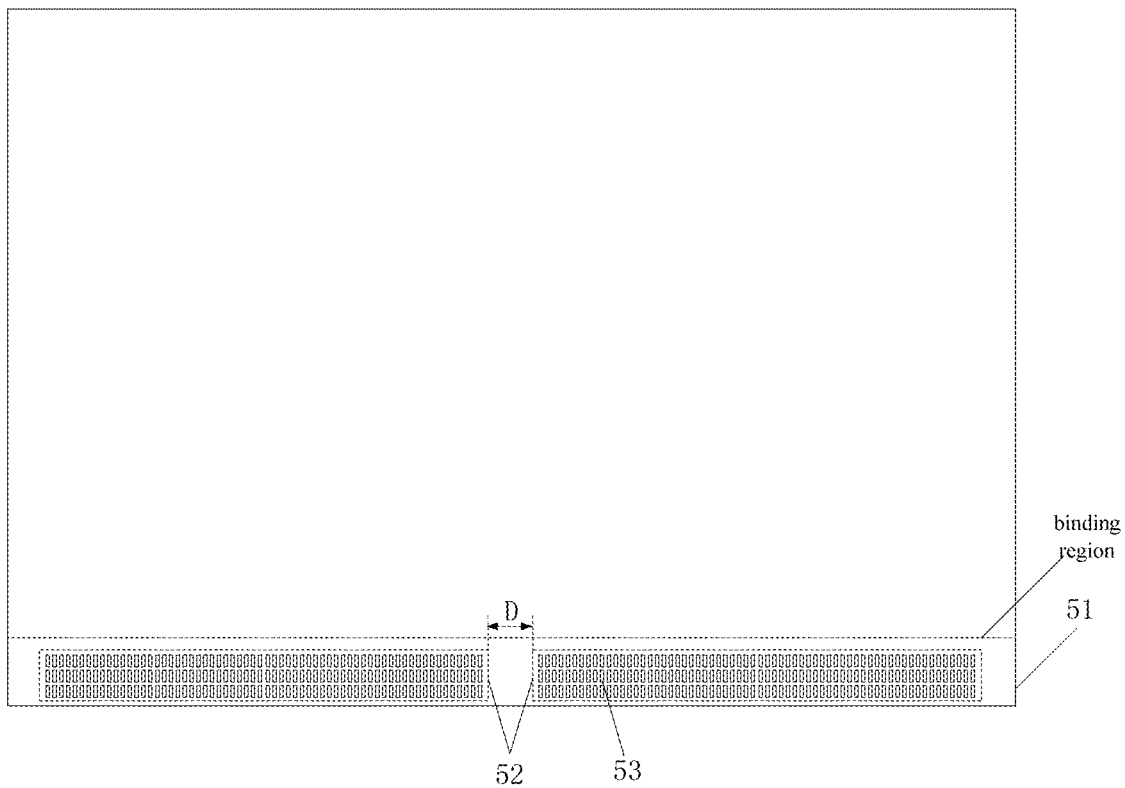
FIG. 5 shows a planar structural schematic diagram of the displaying base plate according to an embodiment of the present disclosure.
Figure 6:
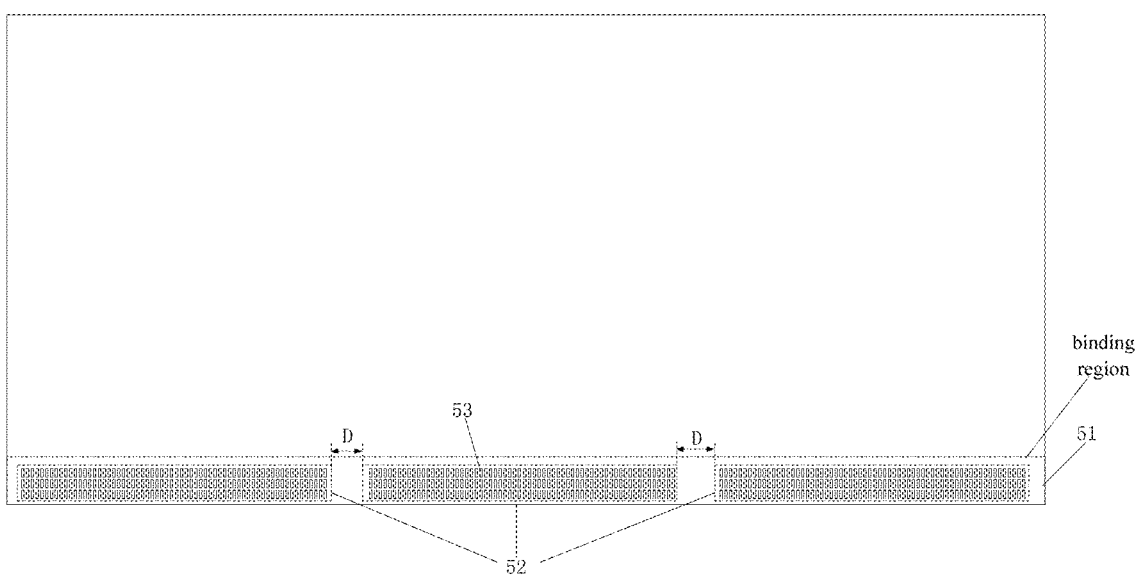
FIG. 6 shows a planar structural schematic diagram of another displaying base plate according to an embodiment of the present disclosure.

Another embodiment of the present disclosure further provides a displaying base plate, wherein the displaying base plate is applied to the Chip-On-Film structure according to any one of the above embodiments. Referring to FIGS. 5 and 6, the displaying base plate comprises a binding region, and the binding region of the displaying base plate comprises: a second substrate 51; and one or more bonding pads 52 provided on one side of the second substrate 51, each of the bonding pads 52 comprises a plurality of second leads 53, and the second leads 53 are for binding different first leads 33.

In a particular embodiment, the quantity of the second leads 53 in each of the bonding pads 52 may be equal to the quantity of the first leads 33 in the Chip-On-Film structure, and the second leads 53 are for binding different first leads 33.

The displaying base plate according to the present embodiment, by providing at the binding region the bonding pads corresponding to the Chip-On-Film structure, can bind the Chip-On-Film structure stated above on the bonding pads of the displaying base plate. Because the Chip-On-Film structure stated above comprises the plurality of driving chips, the present embodiment can reduce the quantity of the Chip-On-Film structures that the displaying base plate requires to bind, and increase the spacing between the Chip-On-Film structures, which, during the technical process of binding the Chip-On-Film structures, can prevent adverse effects by a high temperature on the Chip-On-Film structures that have been completely bound, thereby satisfying the requirements by the process and the production.

In an alternative embodiment, the displaying base plate according to the present embodiment may comprise a plurality of bonding pads 52, and the spacings D between two neighboring bonding pads 52 may be greater than or equal to 4 mm. Because the bonding pads in the binding region are used to bind the Chip-On-Film structures, when the spacings between two neighboring bonding pads are greater than or equal to 4 mm, that can ensure that the spacing between the Chip-On-Film structures is greater than or equal to 4 mm, thereby satisfying the requirements by the process.

In an alternative embodiment, when the first leads 33 are arranged into a predetermined quantity of rows, the second leads 53 are arranged in the first direction into the predetermined quantity of rows. For example, when the first leads 33 in the Chip-On-Film structure are arranged in the first direction into two rows, the second leads 53 of the bonding pads 52 are arranged in the first direction into two rows. When the first leads 33 in the Chip-On-Film structure are arranged in the first direction into three rows, the second leads 53 of the bonding pads 52 are arranged in the first direction into three rows.

Another embodiment of the present disclosure further provides a displaying device. Referring to FIGS. 7 and 8, the displaying device comprises the Chip-On-Film structure 71 according to any one of the above embodiments and the displaying base plate 72 according to any one of the above embodiments. The displaying base plate 72 comprises a binding region. The Chip-On-Film structure 71 is located at the binding region of the displaying base plate 72.

In a particular embodiment, the Chip-On-Film structures 71 are bound to the bonding pads in the displaying base plate 72, the bonding pads in the displaying base plate 72 correspond to the Chip-On-Film structures 71 one to one, and the second leads of the bonding pads correspond to the first leads in the Chip-On-Film structures 71 one to one.

In an alternative embodiment, the displaying device may comprise a plurality of Chip-On-Film structures 71, the quantity of the bonding pads in the displaying base plate 72 is equal to the quantity of the Chip-On-Film structures 71, and the Chip-On-Film structures 71 are located on different bonding pads.

The displaying device shown in FIG. 7 comprises three Chip-On-Film structures 71, each of the Chip-On-Film structures 71 comprises two driving chips, the displaying base plate 72 comprises three bonding pads, and the quantity of the second leads in each of the bonding pads may be equal to the quantity of the first leads in the Chip-On-Film structures. The displaying device shown in FIG. 8 comprises two Chip-On-Film structures 71, each of the Chip-On-Film structures 71 comprises three driving chips, the displaying base plate 72 comprises two bonding pads, and the quantity of the second leads in each of the bonding pads may be equal to the quantity of the first leads in the Chip-On-Film structures. As compared with FIGS. 1 and 2, the spacing between the Chip-On-Film structures in the displaying devices shown in FIGS. 7 and 8 has obviously been increased, which can satisfy the requirements by the process and the production.

In an alternative embodiment, the spacings between two neighboring Chip-On-Film structures in the displaying device may be greater than or equal to 4 mm. Accordingly, during the technical process of binding the Chip-On-Film structures, adverse effects by a high temperature on the Chip-On-Film structures that have been completely bound can be totally prevented.

It should be noted that the displaying device according to the present embodiment may be a displaying base plate, an electronic paper, a mobile phone, a tablet personal computer, a TV set, a notebook computer, a digital photo frame, a navigator and any other products or components that have the function of 2D or 3D displaying.

The present embodiment provides a Chip-On-Film structure, a displaying base plate and a displaying device, wherein the Chip-On-Film structure comprises a first substrate; a plurality of driving chips provided on one side of the first substrate, and a plurality of first leads that are connected to the plurality of driving chips; and the plurality of first leads are for binding a displaying base plate, and a quantity of the first leads is greater than or equal to a sum of quantities of channels of the plurality of driving chips. The technical solutions according to the present disclosure, by providing the plurality of driving chips on the Chip-On-Film structure, can reduce the quantity of the Chip-On-Film structures in the displaying device, and increase the spacing between the Chip-On-Film structures, thereby satisfying the requirements by the process and the production.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The Chip-On-Film structure, the displaying base plate and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A Chip-On-Film structure, wherein the Chip-On-Film structure comprises:
   a first substrate;
   a plurality of driving chips provided on one side of the first substrate, and a plurality of first leads that are connected to the plurality of driving chips; and
   the plurality of first leads are for binding a displaying base plate, and a quantity of the first leads is greater than or equal to a sum of quantities of channels of the plurality of driving chips.

2. The Chip-On-Film structure according to claim 1, wherein the Chip-On-Film structure comprises two or three instances of the driving chips.

3. The Chip-On-Film structure according to claim 1, wherein the plurality of first leads are arranged in a first direction, the plurality of first leads are arranged into a predetermined quantity of rows, and the predetermined quantity is greater than or equal to 2.

4. The Chip-On-Film structure according to claim 3, wherein the predetermined quantity is 3.

5. The Chip-On-Film structure according to claim 3, wherein a spacing between any two of the driving chips in the first direction is greater than or equal to 4 mm and less than or equal to 8 mm.

6. The Chip-On-Film structure according to claim 3, wherein when the Chip-On-Film structure comprises three instances of the driving chips, a spacing between any two neighboring instances of the driving chips in a direction perpendicular to the first direction is greater than or equal to 4 mm.

7. The Chip-On-Film structure according to claim 3, wherein a spacing between each of the driving chips and a first boundary of the first substrate is greater than or equal to 2 mm, wherein the first boundary is a boundary of the first substrate that is perpendicular to the first direction.

8. A displaying base plate, wherein the displaying base plate is applied to the Chip-On-Film structure according to claim 1, the displaying base plate comprises a binding region, and the binding region of the displaying base plate comprises:
   a second substrate; and
   one or more bonding pads provided on one side of the second substrate, wherein each of the bonding pads comprises a plurality of second leads, and the second leads are for binding different instances of the first leads.

9. The displaying base plate according to claim 8, wherein the displaying base plate comprises a plurality of the bonding pads, and a spacing between two neighboring instances of the bonding pads is greater than or equal to 4 mm.

10. The displaying base plate according to claim 8, wherein when the first leads are arranged into a predetermined quantity of rows, the second leads are arranged in the first direction into the predetermined quantity of rows.

11. A displaying device, wherein the displaying device comprises a displaying base plate and the Chip-On-Film structure according to claim 1, the displaying base plate comprises a binding region, and the Chip-On-Film structure is located at the binding region.

12. The displaying device according to claim 11, wherein the binding region of the displaying base plate comprises:
   a second substrate; and
   one or more bonding pads provided on one side of the second substrate, wherein each of the bonding pads comprises a plurality of second leads, and the second leads are for binding different instances of the first leads.

13. The displaying device according to claim 12, wherein the displaying base plate comprises a plurality of the bonding pads, and a spacing between two neighboring instances of the bonding pads is greater than or equal to 4 mm.

14. The displaying device according to claim 12, wherein when the first leads are arranged into a predetermined quantity of rows, the second leads are arranged in the first direction into the predetermined quantity of rows.

15. The displaying device according to claim 11, wherein the displaying device comprises a plurality of instances of the Chip-On-Film structure, a quantity of the bonding pads in the displaying base plate is equal to a quantity of the Chip-On-Film structures, and the Chip-On-Film structures are located on different instances of the bonding pads.

16. The displaying device according to claim 15, wherein a spacing between two neighboring instances of the Chip-On-Film structures is greater than or equal to 4 mm.

\* \* \* \* \*